US 8,416,956 B2

(12) United States Patent
Honda

(10) Patent No.: US 8,416,956 B2
(45) Date of Patent: Apr. 9, 2013

(54) PROTECTED DIGITAL AUDIO DRIVER

(75) Inventor: Jun Honda, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 1216 days.

(21) Appl. No.: 11/782,920

(22) Filed: Jul. 25, 2007

(65) Prior Publication Data

US 2008/0037807 A1 Feb. 14, 2008

Related U.S. Application Data

(60) Provisional application No. 60/820,376, filed on Jul. 26, 2006.

(51) Int. Cl.
*H03G 11/00* (2006.01)
*H04R 3/00* (2006.01)
*H03F 1/04* (2006.01)
*H03F 3/217* (2006.01)

(52) U.S. Cl.
USPC ............. 381/55; 381/117; 381/123; 330/251; 330/207 A; 330/207 P

(58) Field of Classification Search ................... 381/120, 381/55, 111, 116, 117, 123, 28; 330/251, 330/10, 207 A, 207 P, 298; 361/93.1, 5, 7, 361/57, 87, 93.9
See application file for complete search history.

(56) References Cited

U.S. PATENT DOCUMENTS

| 5,499,154 A * | 3/1996 | Cullison ........................ 361/18 |
| 7,408,307 B2 * | 8/2008 | Ribarich ........................ 315/291 |
| 2006/0133002 A1 * | 6/2006 | Kanoh et al. ................. 361/93.7 |

* cited by examiner

*Primary Examiner* — Xu Mei
(74) *Attorney, Agent, or Firm* — Farjami & Farjami LLP

(57) ABSTRACT

A digital audio driver having a floating PWM input and for controlling a stage of high voltage, high speed high- and low-side MOSFETs series connected at a node. The driver includes a floating input interface circuit having a protection circuit to provide secure protection sequence against over-current conditions; and high and low side circuits for driving the high- and low-side MOSFETs, each high and low side circuit including a bi-directional current sensing circuit which requires no external shunt resistors that enables capture of over-current conditions at either positive or negative load current direction. The $R_{DS(ON)}$ of the high- and low-side MOSFETs is used as current sensing resistors, once the $R_{DS(ON)}$ exceeds a pre-determined threshold, an over current output signal is fed to the protection block to shutdown the MOSFET to protect the devices.

17 Claims, 15 Drawing Sheets

PROTECTED DIGITAL AUDIO DRIVER

CROSS-REFERENCE TO RELATED APPLICATION

This application is based on and claims priority to U.S. Provisional Patent Application Ser. No. 60/820,376, filed on Jul. 26, 2006 and entitled PROTECTED DIGITAL AUDIO DRIVER, the entire contents of which are hereby incorporated by reference herein.

BACKGROUND OF THE INVENTION

The present invention relates to class D audio amplifiers and more particularly to a gate driver with a floating PWM input specially designed for Class D audio amplifier applications.

SUMMARY OF THE INVENTION

It is an object of the present invention to provide bi-directional current sensing without requiring external shunt resistors.

It is another object of the present invention to enable capture of over-current conditions at either positive or negative load current direction.

A digital audio driver having a floating PWM input and for controlling a stage of high voltage, high speed high- and low-side MOSFETs series connected at a node. The driver includes a floating input interface circuit having a protection circuit to provide secure protection sequence against over-current conditions; and high and low side circuits for driving the high- and low-side MOSFETs, each high and low side circuit including a bi-directional current sensing circuit which requires no external shunt resistors that enables capture of over-current conditions at either positive or negative load current direction. The $R_{DS(ON)}$ of the high- and low-side MOSFETs is used as current sensing resistors, once the $R_{DS(ON)}$ exceeds a pre-determined threshold, an over current output signal is fed to the protection block to shutdown the MOSFET to protect the devices.

Other features and advantages of the present invention will become apparent from the following description of the invention that refers to the accompanying drawings.

DETAILED DESCRIPTION OF EMBODIMENTS OF THE INVENTION

Figure 1:
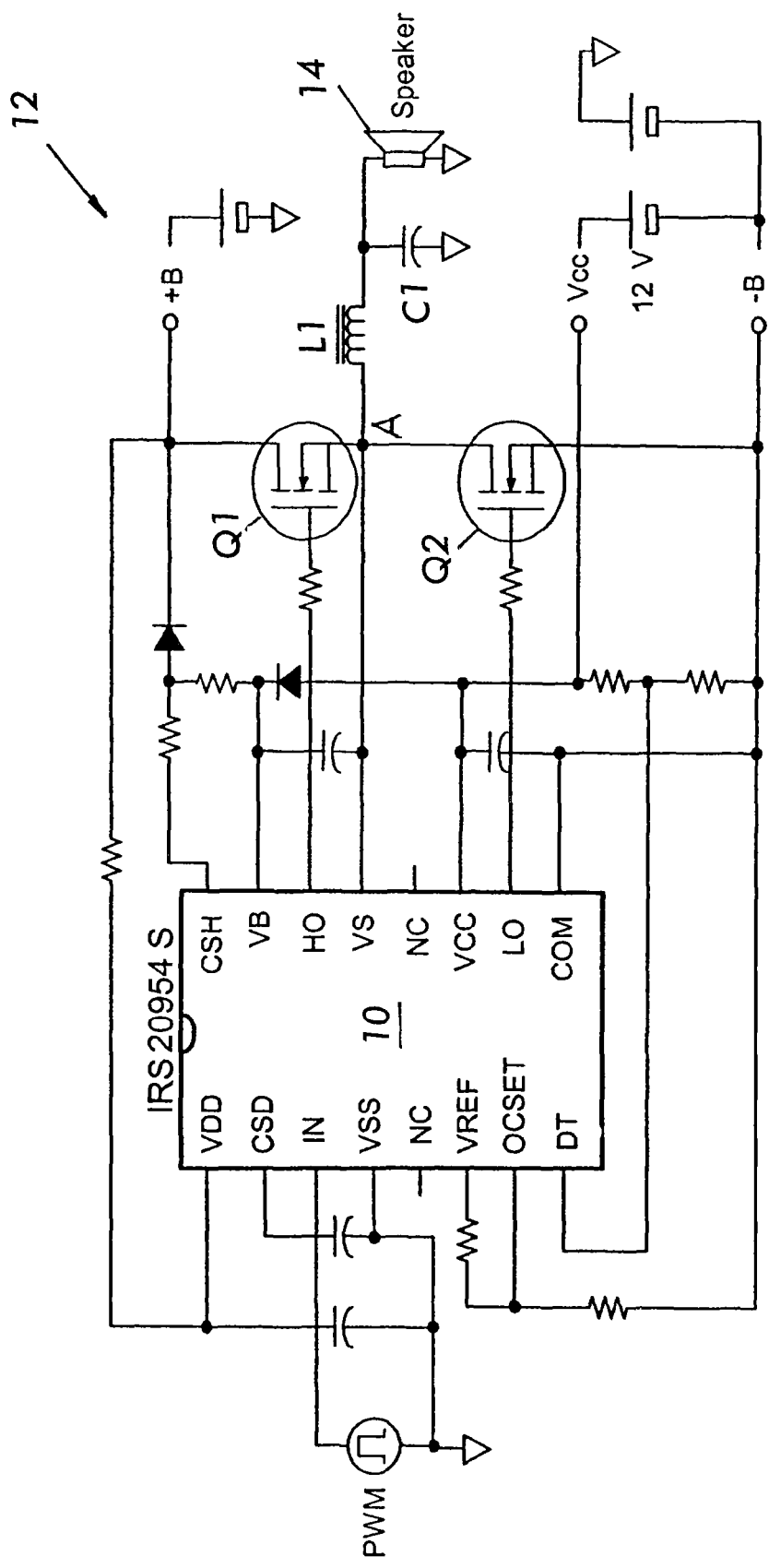
FIG. 1 is a diagram of a converter circuit that includes a driver IC of the present invention.

FIG. 1 illustrates a circuit 12 that uses a high voltage, high speed MOSFET driver IC 10 of the present invention having a floating PWM input for driving a half-bridge stage of high- and low-side switches Q1 and Q2 series connected at a switching node A. The driver IC 10 is specially designed for Class D audio amplifier applications to amplify a speaker 14 that is connected to the switching node A via an inductor L1, with a first terminal of a capacitor C1 being connected between the inductor L1 and the speaker 14. The second terminal of the capacitor C1 is connected to the ground.

The driver IC 10 includes bi-directional current sensing circuitry, which does not require external shunt resistors. The driver IC 10 can capture over-current conditions at either positive or negative load current direction. It includes a built-in control block that provides secure protection sequence against over-current conditions, including a programmable reset timer and an internal deadtime generation block that provides accurate gate switch timing and enables optimum deadtime settings for better audio performances, such as THD and audio noise floor.

Figure 2:
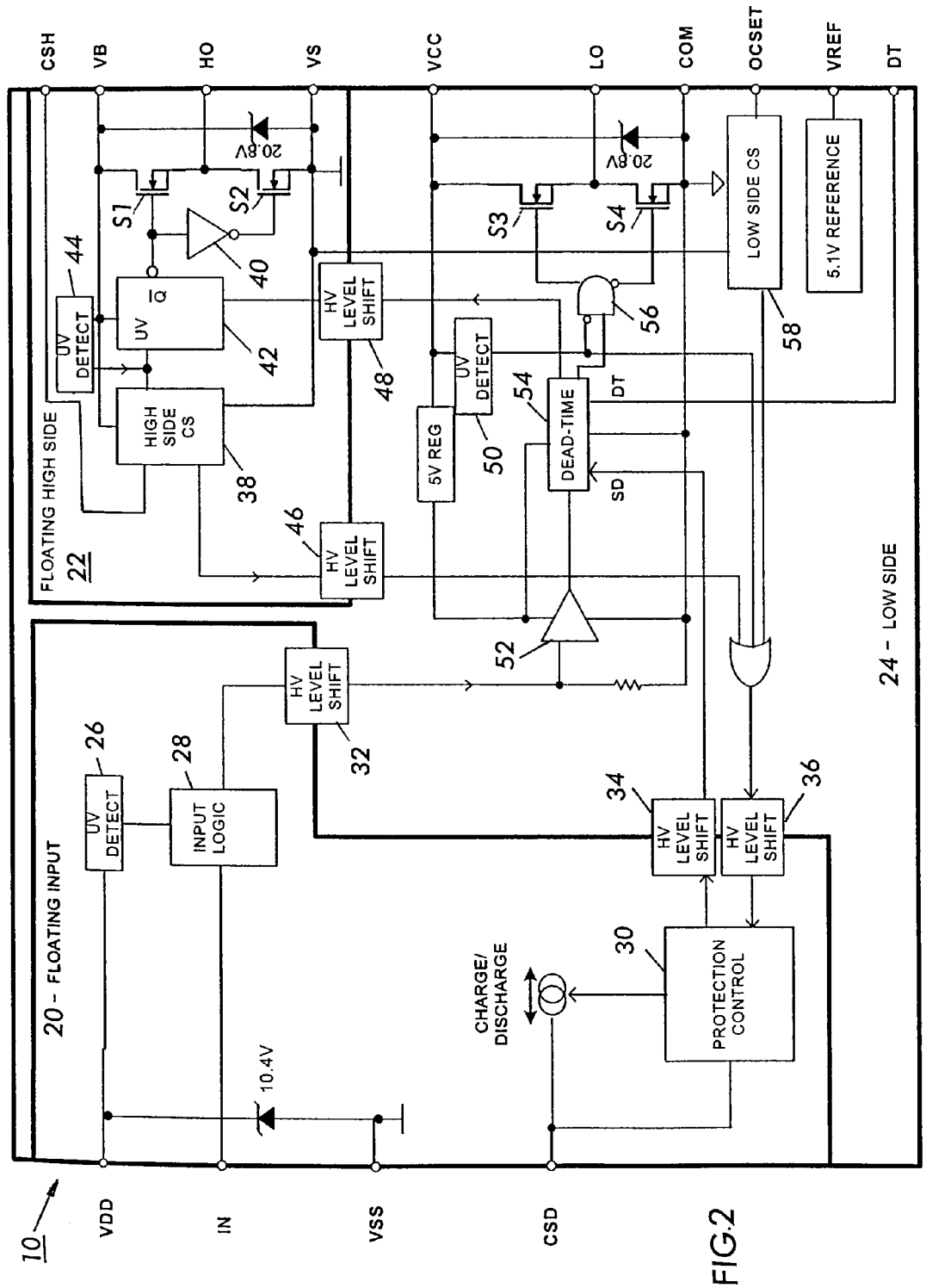
FIG. 2 is a block diagram illustrating component circuits integrated in the driver IC of the present invention.

FIG. 2 illustrates component circuits integrated in the driver IC 10. The component circuits, which will be described in detail below include a floating input interface circuit 20, a floating high side circuit 22, and a low side circuit 24.

The floating high side circuit 22 includes high side floating supply return pin VS; high side output pin HO; high side floating supply pin VB; and high side over-current sensing input pin CSH referenced to pin VS and connected to a high side over-current sensing circuit 38. A half-bridge stage having two switches S1 and S2 series connected at a first node is connected to pins VB and VS, with the first node being connected at pin HO. The floating high side circuit 22 further includes an undervoltage detection circuit 44, a controlling circuit 42 for providing an enabling signal to the switch S1, an inverter circuit 40 connected between gate terminals of the two switches S1 and S2 for providing inverse of the enabling signal to the switch S2 or to disable the second switch when the first switch is being enabled, and two level-shift circuits 46 and 48 for level shifting signals from the high side overcurrent sensing to the controlling circuit circuits 38 and 42.

The low side circuit 24 includes reference output pin VREF 5V for setting pin OCSET connected to a low side current sensing circuit 58; low side over-current threshold setting pin OCSET referenced to pin COM; input for programmable deadtime pin DT referenced to pin COM; low side supply return pin COM; low side output pin LO; and low side logic supply pin VCC. A half-bridge stage having two switches S3 and S4 series connected at a second node is connected to pins VCC and COM, with the second node being connected at pin LO. The low side circuit 24 further includes an undervoltage detection circuit 50, a low controlling circuit including an amplifier 52, a dead time circuit 54 and an AND circuit 56 for providing an enabling signal to the switches S3 and S4.

Functional Description

The floating input interface circuit 20 enables easy half bridge implementation, it includes floating input positive supply pin VDD connected to an undervoltage detection circuit 26; timing capacitor shutdown pin CSD connected to a protection control circuit 30; PWM non-inverting input pin IN in phase with pin HO connected to an input logic circuit 28; and floating input supply return pin VSS. The floating input circuit 20 further includes level-shift circuits 32, 34, and 36 for level shifting signals from the input logic and protection control circuits 28 and 30.

Figure 3A:
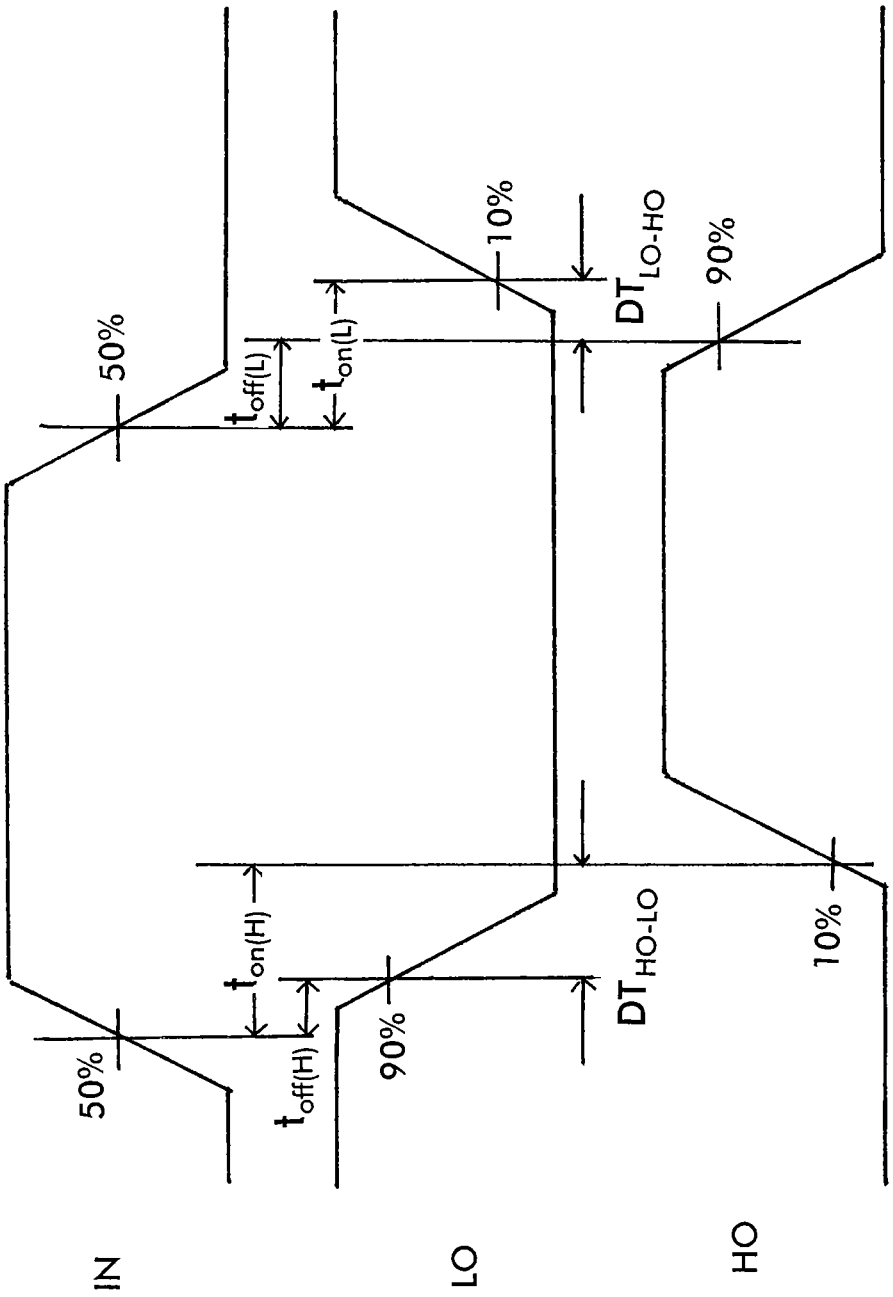
FIGS. 3a-3c are graphs illustrating switching time, CSD, CSH, and Vs to shutdown waveforms produced by operation of the driver IC of the present invention.
Figure 3B:
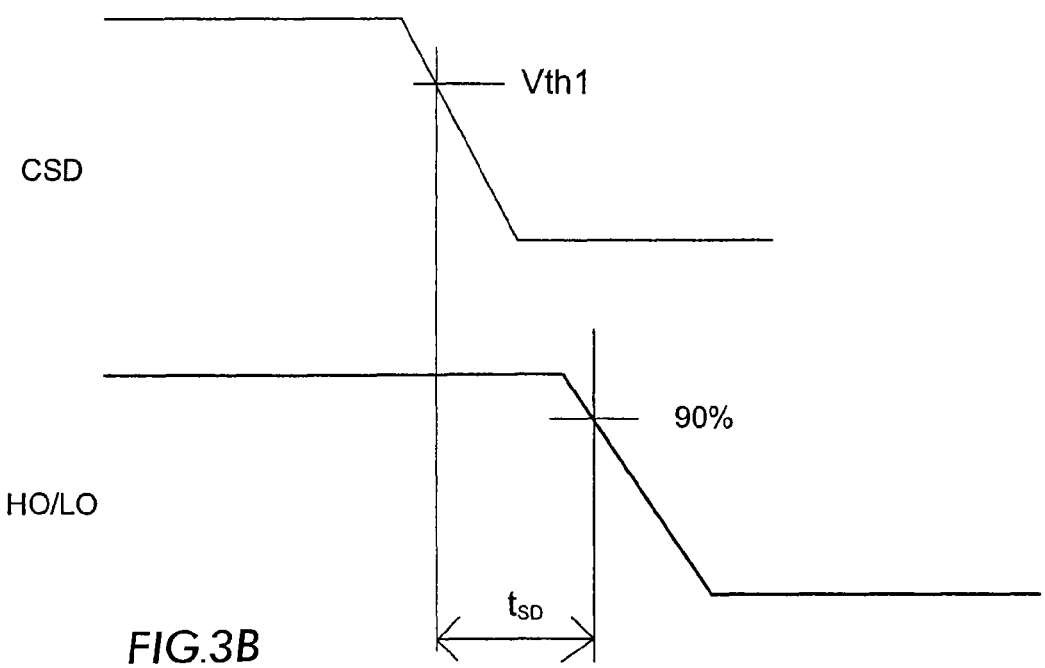
Figure 3C:
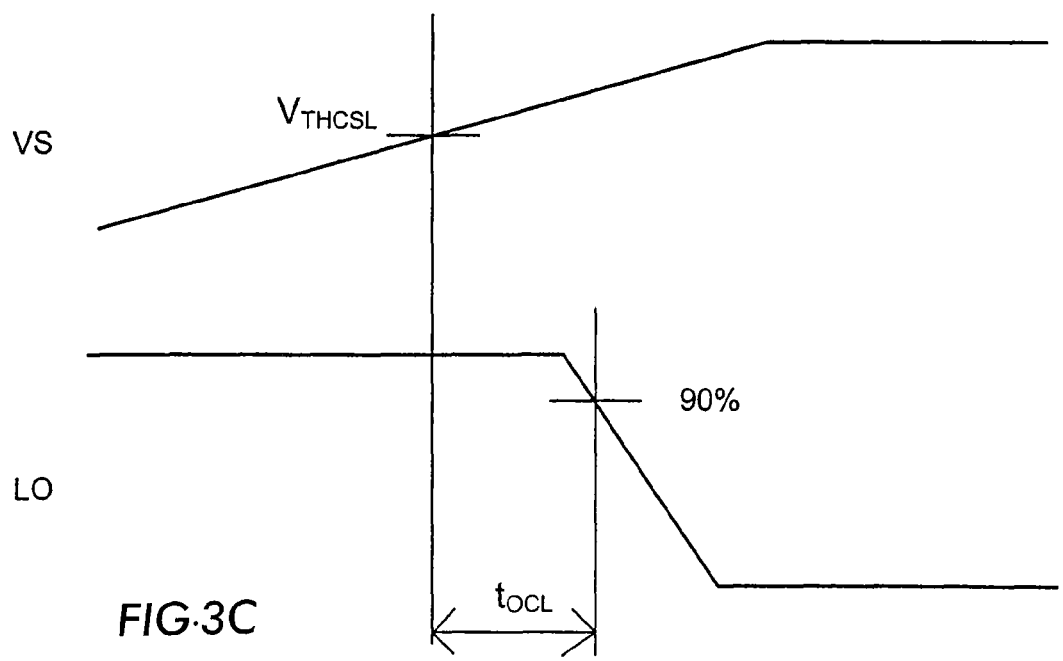

Waveforms produced by operation of the driver IC of the present invention are illustrated in FIGS. 3a-3c. FIG. 3a illustrates signals at pins LO and HO alternatively decreasing and increasing as a signal at pin IN goes High and Low. FIG. 3b illustrates time to shutdown $t_{SD}$ measured from a first threshold voltage $V_{th1}$ that is preset at a certain voltage level of pin CSD to 90% level of voltage at pins HO and LO. FIG. 3c illustrates time to shutdown $t_{OCL}$ at LO pin, measured from a point when a high side floating supply voltage reaches over current threshold voltage $V_{TH,OCH}$ to 90% level of voltage at pin LO.

Figure 4:
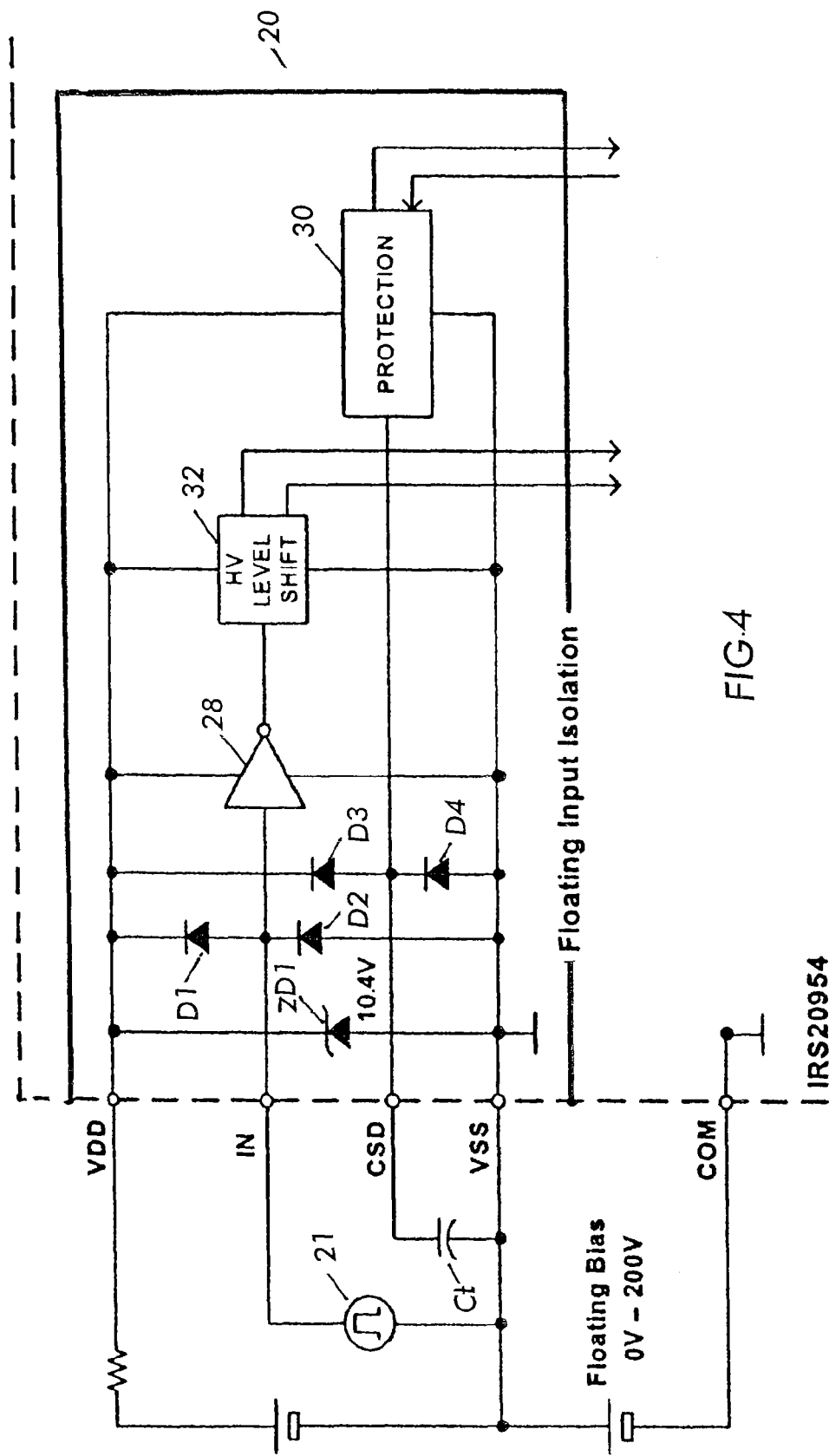
FIG. 4 is a circuit diagram showing floating PWM input structure including a timing capacitor of the driver IC of the present invention.

As illustrated in FIG. 4a, pins VDD, CSD and IN, are referenced to pin VSS using diodes D1-D4 and a Zener diode ZD1. As a result, a PWM input signal 21 can be directly fed into pin IN referencing the ground, which is typically a middle point of a DC bus in half bridge configurations. Also, as illustrated, the circuit 20 includes a non-floating input with pin VSS tied to pin COM of the low side circuit 24.

In order to protect the power MOSFETs Q1 and Q2 (FIG. 1) from over load conditions, the driver IC 10 provides overcurrent protection by entering a shutdown mode when it detects over-current condition from the low side or high side current sensing circuits 38 (FIG. 2) and 58.

Figure 5A:
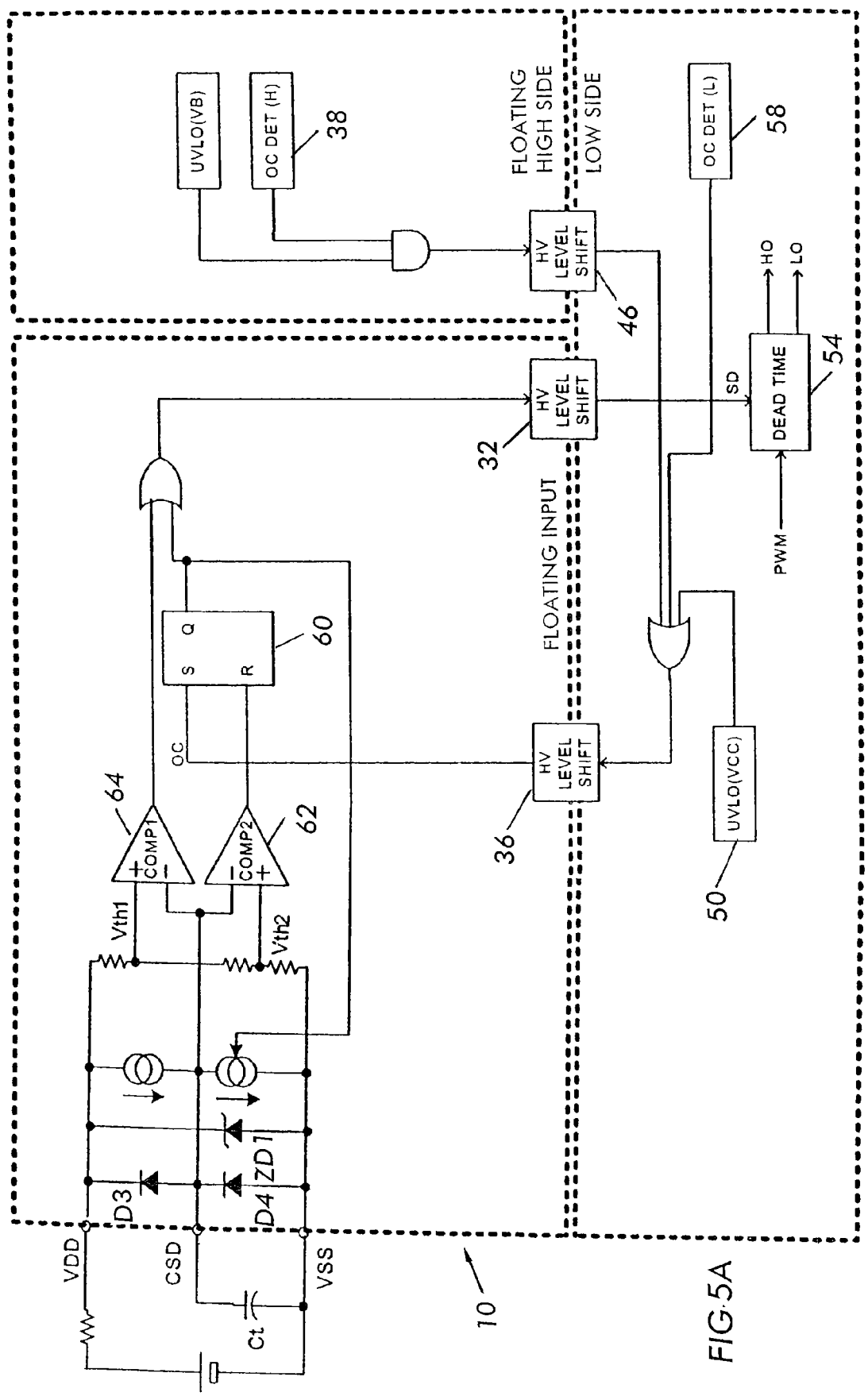
FIG. 5a is a circuit diagram showing a timing control of the driver IC of the present invention.
Figure 5B:
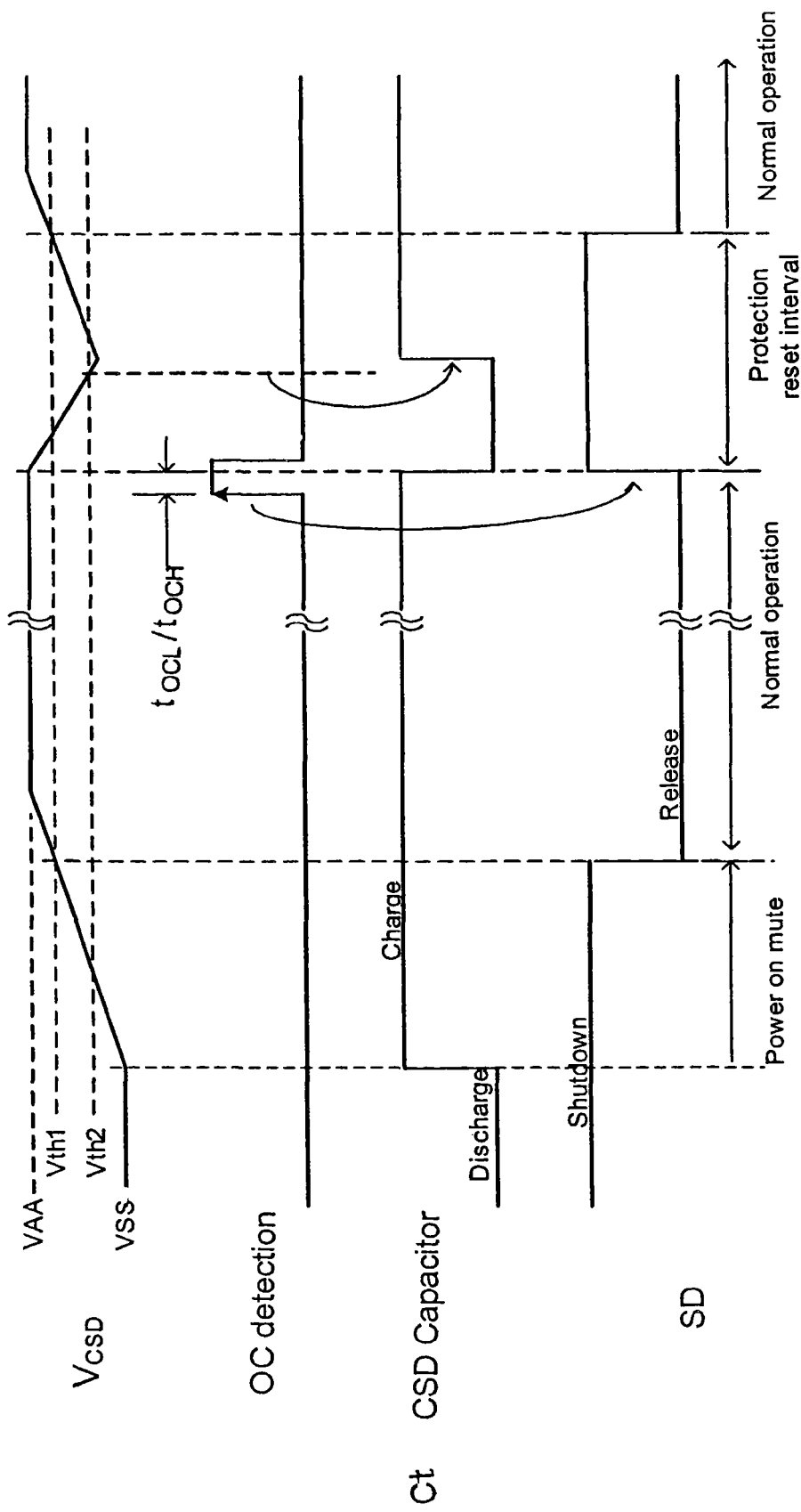
FIG. 5b is a graph showing an over-current protection sequence of the driver IC of the present invention.

A timing control circuit of the driver IC 10 measures a resume timing interval using an external timing capacitor $C_t$ connected at pin CSD. All the critical timing of the overcurrent protection is guaranteed for secure protection. The sequence of the over-current detection sequence, described below with reference to FIGS. 5a and 5b, is repeated until the cause of over-current is no-longer present. The sequence is as follows:

When either high or low side current sensing circuits 38 and 58 detect over-current condition, an over current Latch circuit 60 flips, and using the dead time circuit 54 shuts down the outputs at pins LO and HO. This results in pin CSD starting to discharge the external capacitor $C_t$.

When voltage at pin CSD $V_{CSD}$ crosses a lower threshold Vth2, a signal COMP2 from a comparator circuit 62 resets the over current Latch circuit 60. This results in pin CSD starting to charge the external capacitor $C_t$.

When voltage at pin CSD $V_{SCD}$ crosses the upper threshold Vth1, a signal COMP1 from a comparator circuit 64 flips, enabling a release of the shutdown signal.

An examplary time graph of the above described over-current protection sequence of the driver IC 10 is illustrated in FIG. 5b.

Figure 6B:
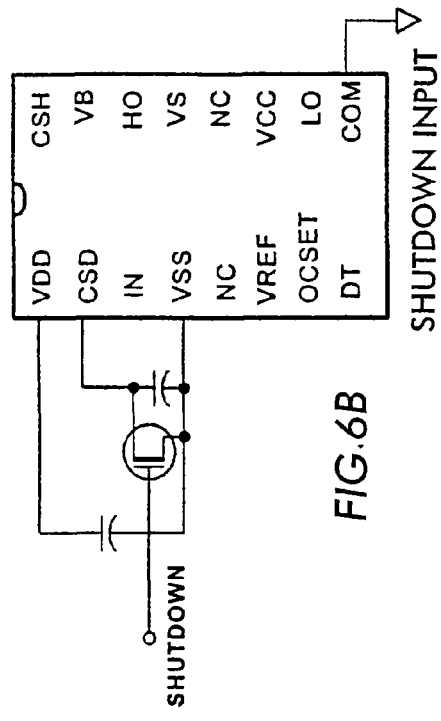
FIG. 6b is a diagram illustrating discharging of the external timing capacitor to below the lower threshold for the driver IC of the present invention to enter a shutdown mode.
Figure 6A:
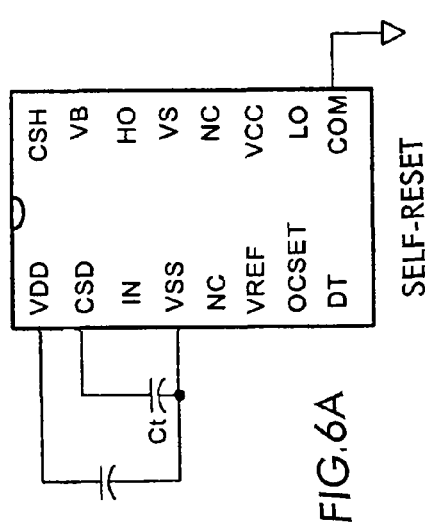
FIG. 6a is a diagram illustrating connection of an external timing capacitor self-reset protection configuration to the driver IC of the present invention.

As the shutdown mode forces pins LO and HO to output 0V to pins COM and VS respectively to turn the power MOSFET OFF, an operational mode between shutdown and normal modes is managed with a help from pin CSD. The external capacitor $C_t$ at pin CSD helps provide functions of power up delay timer for self reset configuration; self-reset configuration; Shutdown input; latched protection configuration; and shutdown status output (host I/F). By including the capacitor $C_t$ between the CSD and $V_{SS}$ (FIG. 6a), the over-current protection in the driver IC 10 acts as self.

The timing capacitor Ct programs a protection resume interval timing $t_{PR}$ given as:

$$t_{PR} = 1.1 \cdot \frac{Ct \cdot V_{DD}}{I_{CSD}} [\sec] \text{ or } Ct = \frac{T_{PR} \cdot I_{CSD}}{1.1 \cdot V_{DD}} [F].$$

For example, $t_{PR}$ may be 1.2 s with a 10 µF capacitor for VDD=10.8 V. The start-up time $t_{su}$, from power-up to shutdown release, is given as:

$$t_{SU} = 0.7 \cdot \frac{Ct \cdot V_{DD}}{I_{CSD}} [\sec] \text{ or } Ct = \frac{t_{SU} \cdot I_{CSD}}{0.7 \cdot V_{DD}} [F],$$

where charge/discharge current at pin CSD $I_{CSD}$ is 100 µA. $V_{DD}$ is supply voltage respect to $V_{SS}$. The protection-resume timing $t_{PR}$ should be long enough to avoid over heating and failure of the MOSFET from the repetitive sequences of shutdown and resume when the load is in continuous short circuit. In most of applications, the minimum recommended protection-resume timing $t_{PR}$ is 0.1 s.

By externally discharging Ct down to below a second threshold voltage $V_{th2}$, for example with a transistor (see FIG. 6b), the driver IC 10 enters a shutdown mode. The operation of the IC resumes when the voltage at CSD pin comes back and crosses an upper voltage threshold Vth1.

Figure 6D:
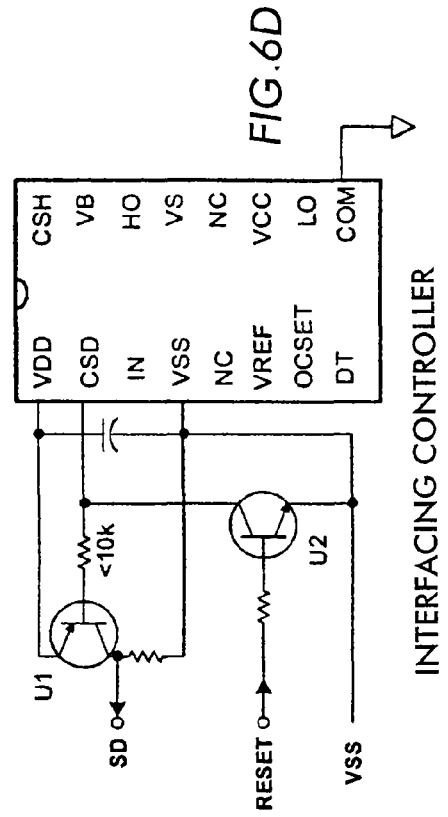
FIG. 6d is a diagram illustrating a configuration of the driver IC of the present invention having an interfacing controller ability allowing communication with an external system controller.
Figure 6C:
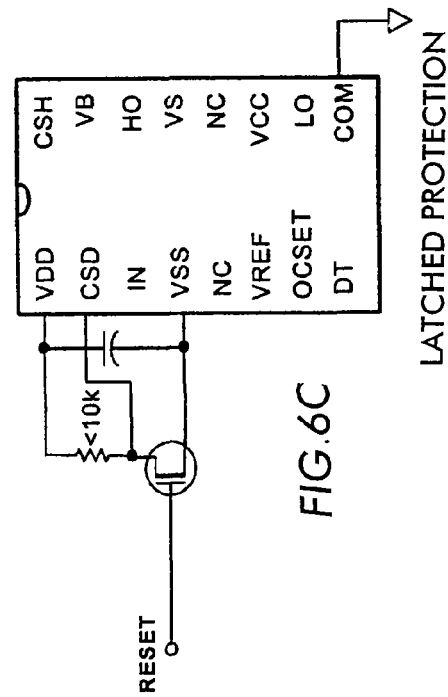
FIG. 6c is a diagram illustrating a configuration of the driver IC of the present invention to have a latched over-current protection.

Further, connecting pin CSD to $V_{DD}$ through a 10 kΩ or less resistor (FIG. 6c) configures the driver IC 10 as a latched over-current protection. The over-current protection stays in shutdown mode after over-current condition detected. To reset the latch status, an external reset switch brings voltage at pin CSD down below the lower threshold, Vth2. Minimum reset pulse width required is 200 ns.

By adding a simple interfacing circuit, which may include a generic PNP-BJT U1, such as 2N3906 (FIG. 6d), the driver IC 10 may communicate with an external system controller. When an over-current protection event occurs, the additional circuit may send out a shutdown (SD) signal by capturing sinking current in pin CSD. Another generic NPN-BJT U2, such as 2N3094 (FIG. 6d), may be used to reset the internal protection logic by pulling the voltage at pin CSD below the second threshold Vth2. Note that pin CSD is shown to be configured as a latched type over-current protection.

Figure 7:
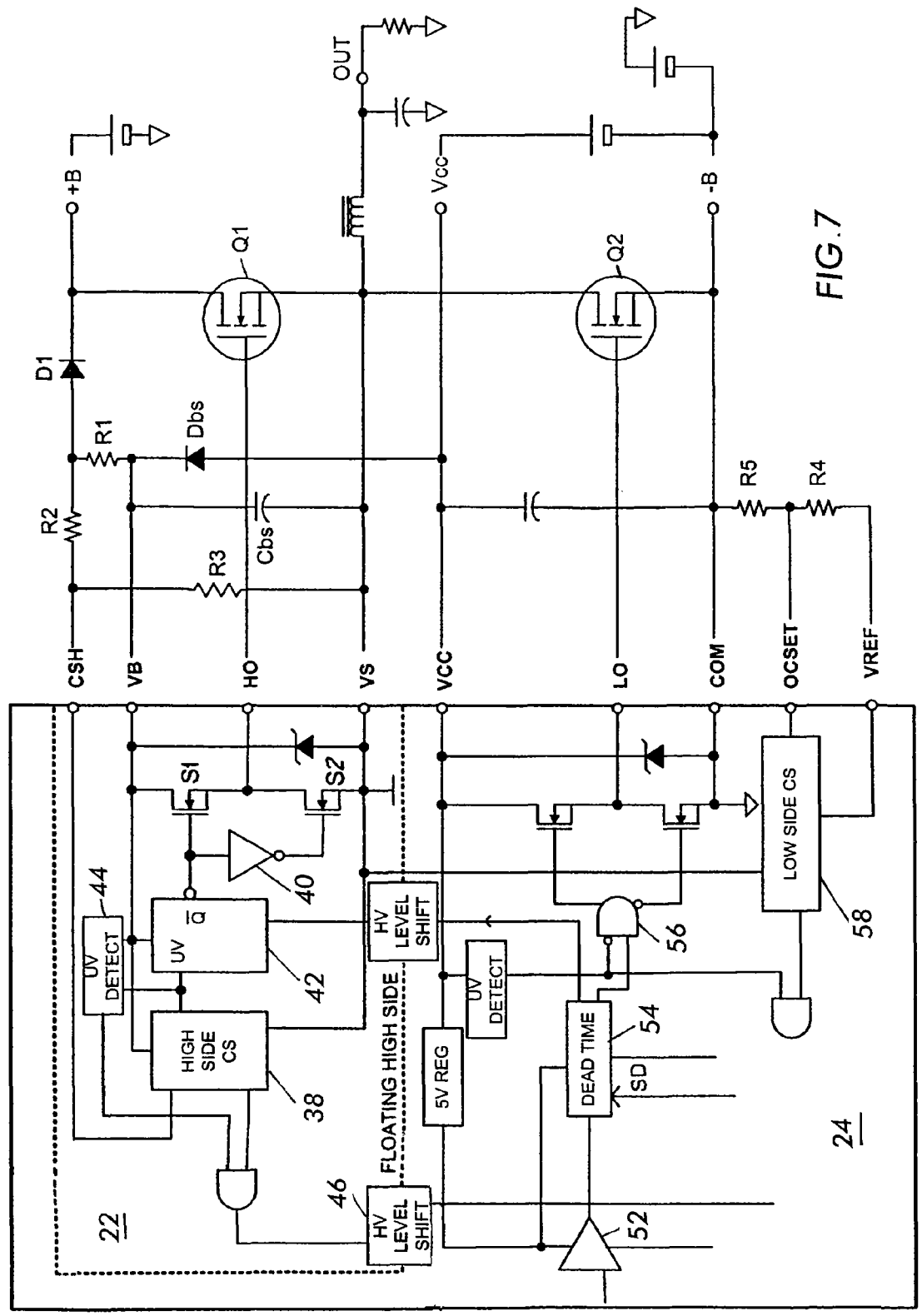
FIG. 7 is a diagram illustrating bi-directional over-current protection provided by the driver IC of the present invention.

In Class D audio amplifiers, the direction of the load current alternates according to the audio input signal. An over-current condition can therefore happen during either a positive current cycle or a negative current cycle. As illustrated in FIG. 7, the driver IC 10 uses $R_{DS(ON)}$ in the output MOSFET as current sensing resistors. Due to the high voltage IC structural constraints, high and low side switches Q1 and Q2 have different implementations of current sensing. Once measured current exceeds a pre-determined threshold, an over current output signal is fed to the protection block to shutdown the MOSFET to protect the MOSFET devices.

Figure 8:
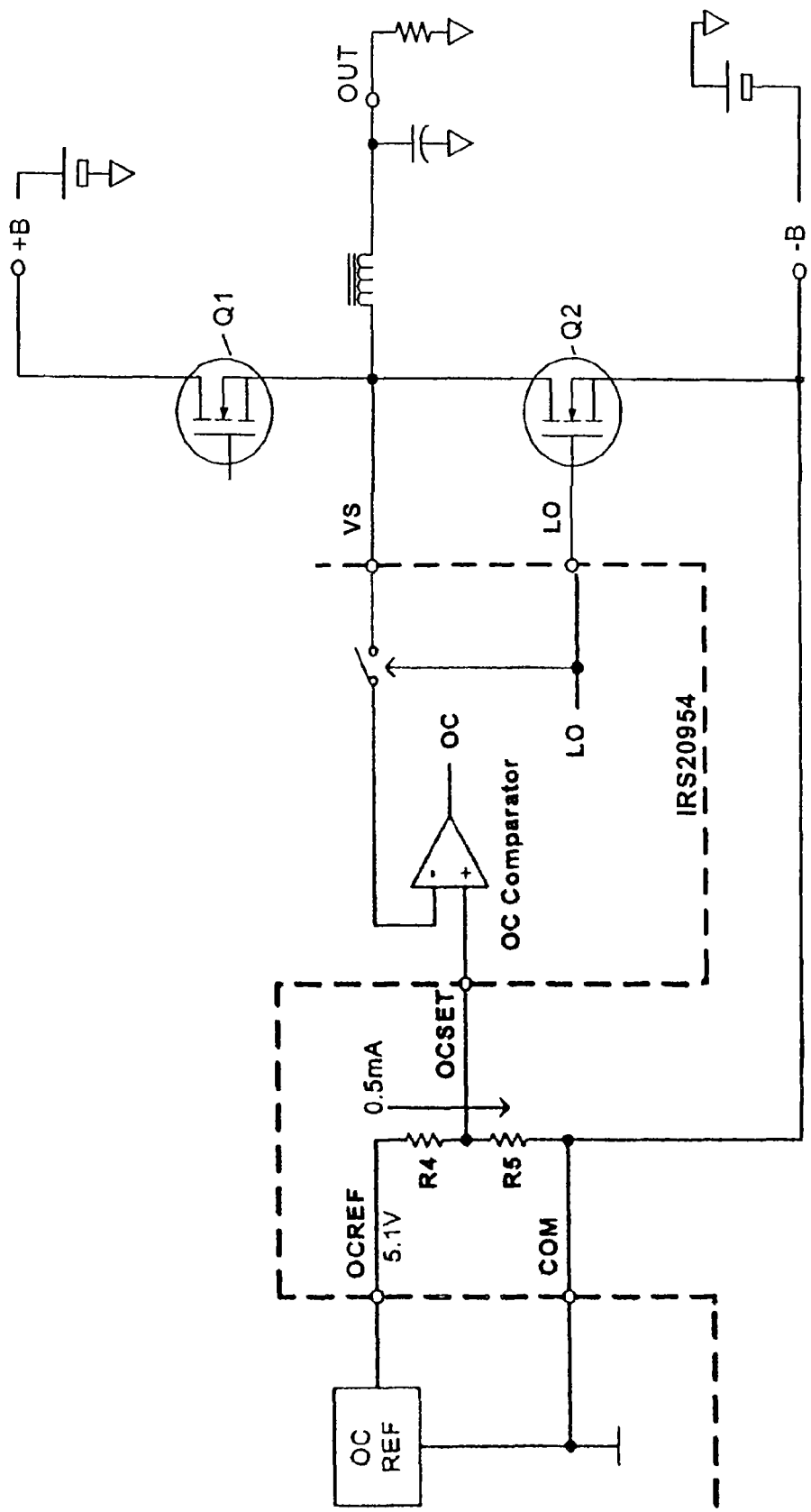
FIG. 8 is a diagram illustrating low-side over-current sensing of the driver IC of the present invention.

For the negative load current, low side over-current sensing, illustrated in FIG. 8, monitors over load condition and shutdown the switching operation if the load current exceeds the preset trip level. The low side current sensing is based on measurement of voltage at VS pin during the low side MOSFET's ON state. In order to avoid incorrect current value due to overshoot, VS pin voltage sensing ignores signals for the first 200 ns after LO pin is turned on.

Returning to FIG. 7, OCSET pin programs the threshold for low side over-current sensing. The threshold voltage at VS pin turning on the over current protection is the same as the voltage applied to OCSET pin to COM. Thus a reference voltage $V_{REF}$ can be used to supply the reference voltage to a resistive divider R4 and R5, generating a voltage to OCSET for better immunity against $V_{CC}$ fluctuations.

Since the voltage sensed at VS pin is compared with the voltages fed to the OCSET pin, the required voltage of OCSET with respect to COM for a trip level $I_{TRIP+}$ is: $V_{OCSET} = V_{DS(low-side)} = I_{TRIP+} \times R_{DS(ON)}$. In order to neglect the input bias current of OCSET pin, 10 kΩ total for R4 and R5 may be used to drain 0.5 mA through the resistors.

Figure 9:
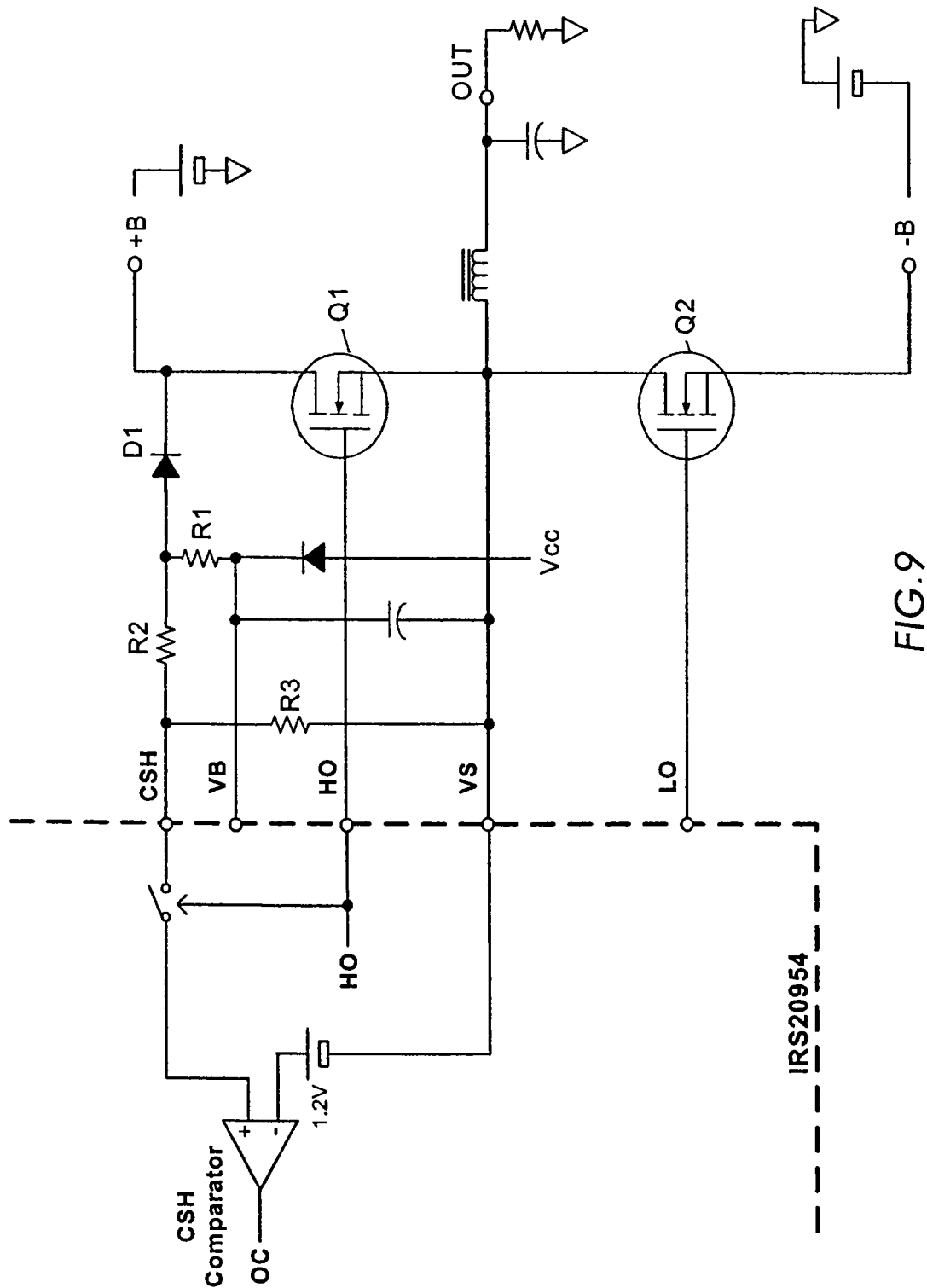
FIG. 9 is a diagram illustrating high-side over-current threshold setting of the driver IC of the present invention.

For the positive load current, high side over-current sensing, illustrated in FIG. 9, monitors over load condition by measuring $V_{DS}$ with CSH and VS pins and shutdown the operation. CSH pin, used to detect the drain-to-source voltage, refers to VS pin which is the source of the high side MOSFET. In order to neglect overshoot ringing at the switching edges, CSH sensing circuitry monitoring is delayed by the first 300 ns the high switch Q1 is on by blanking the signal from CSH pin.

In contrast to the low side current sensing, the threshold of CSH pin to engage over current protection is internally fixed at 1.2 V. An external resistive divider R2 and R3 can be used to program a higher threshold. An external reverse blocking diode D1 blocks high voltage feeding into CSH pin while the high side switch Q1 is OFF. By subtracting a forward voltage drop of 0.6 V at the diode D1, the minimum threshold, which can be set in the high side is 0.6 V across the drain to source.

As shown in FIG. 9, the voltage at CSH pin is:

$$V_{CSH} = \frac{R3}{R2+R3} \cdot (V_{DS(high-side)} + V_{F(D1)}),$$

where: $V_{DS(high-side)}$ is drain to source voltage of the high side MOSFET in its ON state and $VF_{(D1)}$ is the forward drop voltage of D1. Since $V_{DS(high-side)}$ is determined by the product of drain current $I_D$ and $R_{DS(ON)}$ in the high side MOSFET. $V_{CSH}$ can be written as:

$$V_{CSH} = \frac{R3}{R2+R3} \cdot (V_{DS(ON)} \cdot I_D + V_{F(D1)});$$

$$\frac{R2}{R3} = \frac{V_{DS}+V_F}{Vth_{OCH}} - 1.$$

The reverse blocking diode D1 is forward biased by a 10 kΩ resistor R1 when the high side MOSFET is on.

FIG. 9 illustrates the typical peripheral circuit of high side current sensing. For example, the over-current protection level is set to trip at 30 A with a MOSFET with $R_{DS(ON)}$ of 100 mΩ, the component values of R2 and R3 are calculated as: Choose $$R2 + R3 = 10 \text{ k}\Omega, \text{ thus } R_3 = 10 \text{ k}\Omega - R_2.$$

$$R_3 = 10 \text{ k}\Omega \frac{Vth_{OCH}}{V_{DS}+V_F},$$

where $Vth_{OCL}=1.2$ V; $V_F=0.6$ V; $V_{DS@ID=30A}=100$ mΩ×30 A=3V; $V_{DS}$ is the voltage drop at $I_D=30$ A across $R_{DS(ON)}$ of the high side MOSFET. VF is a forward voltage of reverse blocking diode, D1. The values of R2 and R3 from the E-12 series are: R2=6.8 kΩ and R3=3.3 kΩ

The reverse blocking diode D1 is determined by voltage rating and speed. To block bus voltage, reverse voltage has to be higher than (+B)−(−B). Also the reverse recovery time needs to be as fast as a bootstrap charging diode. The Philips BAV21W, 200 V, 50 ns high speed switching diode, is more than sufficient.

Designing with the same MOSFET as in high side $R_{DS(ON)}$ of 100 mΩ, voltage at OCSET pin $V_{OCSET}$ for setting 30 A trip level is given by:

$$V_{OCSET} = I_{TRIP} \times R_{DS(ON)} = 30 \, A \times 100 \text{ m}\Omega = 3.0 \text{ V}.$$

If R4+R5=10 kΩ are chosen for proper loading of VREF pin, thus $$R_5 \frac{V_{OCSET}}{V_{REF}} \cdot 10 \text{ k}\Omega = \frac{3.0 \text{ V}}{5.1 \text{ V}} \cdot 10 \text{ k}\Omega = 5.8 \text{ k}\Omega,$$

where $V_{REF}$ is the output voltage of VREF pin, 5.1 V typical. Here, R5=5.6 kΩ and R4=3.9 kΩ from E-12 series may be chosen.

In general, $R_{DS(ON)}$ has a positive temperature coefficient that needs to be considered when the threshold level is being set. Although this characteristic is preferable from a device protection point of view, these variation needs to be considered as well as variations of external or internal component values.

Deadtime Generator

The deadtime generator block provides a blanking time between the high-side on and low-side on to avoid a simultaneous on state causing shoot-through. The driver IC 10 has an internal deadtime generation block to reduce the number of external components in the output stage of a Class D audio amplifier. Selectable deadtime programmed through the DT/SD pin voltage is an easy and reliable function, which requires only two external resistors. This selectable way of setting deadtime prevents outside noise from modulating the switching timing, which is critical to the audio performances.

Figure 10A:
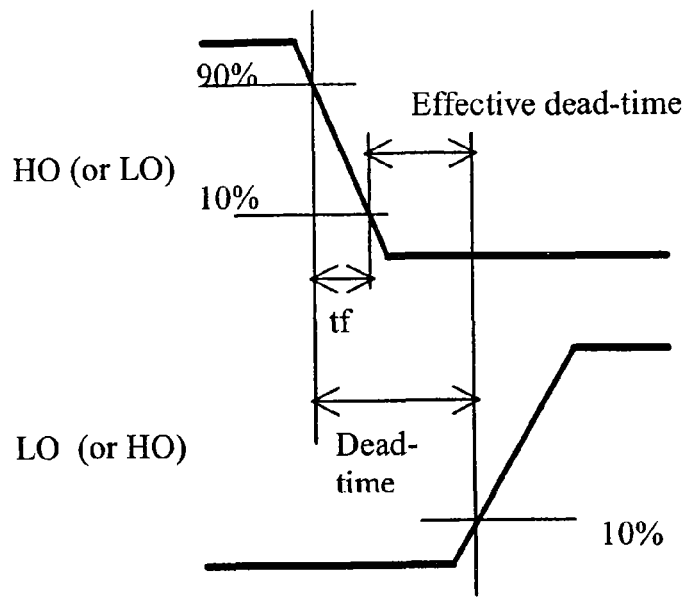
FIGS. 10a and 10b are graphs illustrating effective deadtime and a deadtime plotted vs. voltage set by external voltage divider illustrated in FIG. 10c of the driver IC of the present invention.

The effective deadtime in an actual application differs from the deadtime specified in this specification due to finite switching fall time tf. The deadtime value in this specification is defined as the time period from the starting point of turn-off on one side of the switching stage to the starting point of turn-on on the other side as shown in FIG. 10a. The fall time of MOSFET gate voltage must be subtracted from the deadtime value to determine the effective dead time of a Class D audio amplifier. (Effective deadtime)=(Deadtime)−(fall time, tf)

A longer dead time period is required for a MOSFET with a larger gate charge value because of the longer $t_f$. A shorter effective deadtime setting is always beneficial to achieve better linearity in the Class D switching stage. However, the likelihood of shoot-through current increases with narrower deadtime settings in mass production. Negative values of effective deadtime may cause excessive heat dissipation in the MOSFETs, potentially leading to serious damage. To calculate the optimal deadtime in a given application, the fall time if for both output voltages, HO and LO pins, in the actual circuit needs to be measured. In addition, the effective deadtime can also vary with temperature and device parameter variations. Therefore, a minimum effective deadtime of 10 ns is recommended to avoid shoot-through current over the range of operating temperatures and supply voltages.

Figure 10B:
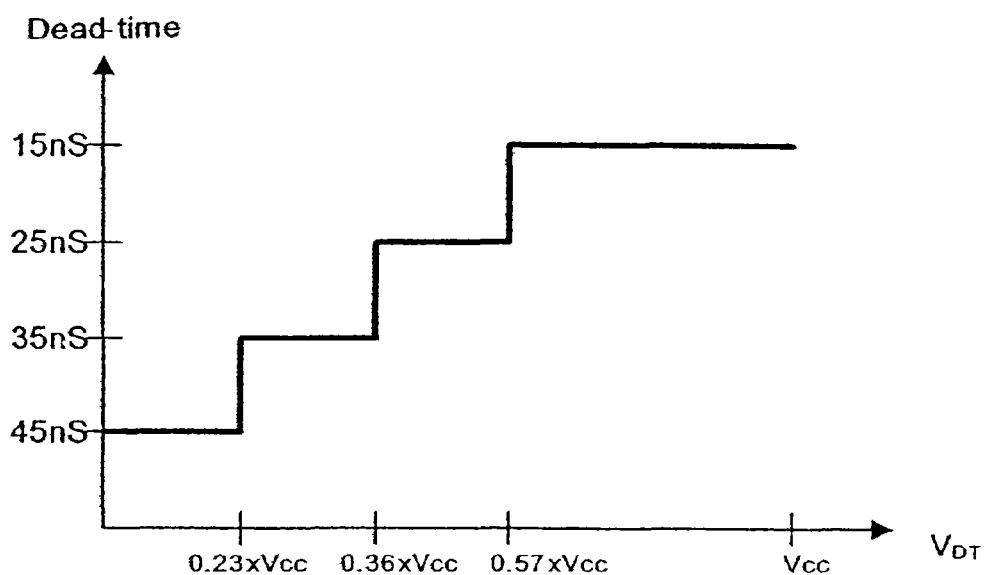

DT pin provides a function setting deadtime. The driver IC 10 determines its deadtime based on the voltage applied to the DT pin. An internal comparator translates which pre-determined deadtime is being used by comparing internal reference voltages. Threshold voltages for each mode are set internally by a resistive voltage divider off $V_{CC}$, negating the need of using a precise absolute voltage to set the mode. The relationship between the operation mode and the voltage at DT pin is illustrated in the FIG. 10b.

Figure 10C:
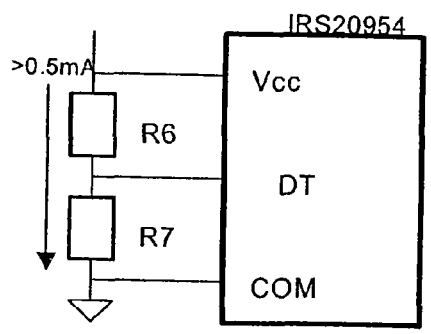
FIG. 10c is a diagram illustrating the external voltage divider for programming deadtime of the driver IC of the present invention.

Suggested values of resistance for setting the deadtime, as illustrated in FIG. 10c, are provided in Table 1. Resistors with up to 5% tolerance can be used if these listed values are followed.

TABLE 1

Suggested Resistor Values for Deadtime Settings

| Deadtime mode | R6 | R7 | DT/SD voltage |
|---|---|---|---|
| DT1 | <10 kΩ | Open | 1.0. ($V_{CC}$) |
| DT2 | 3.3 KΩ | 8.2 kΩ | 0.71. ($V_{CC}$) |
| DT3 | 5.6 kΩ | 4.7 kΩ | 0.46. ($V_{CC}$) |
| DT4 | 8.2 kΩ | 3.3 kΩ | 0.29. ($V_{CC}$) |

Figure 11:
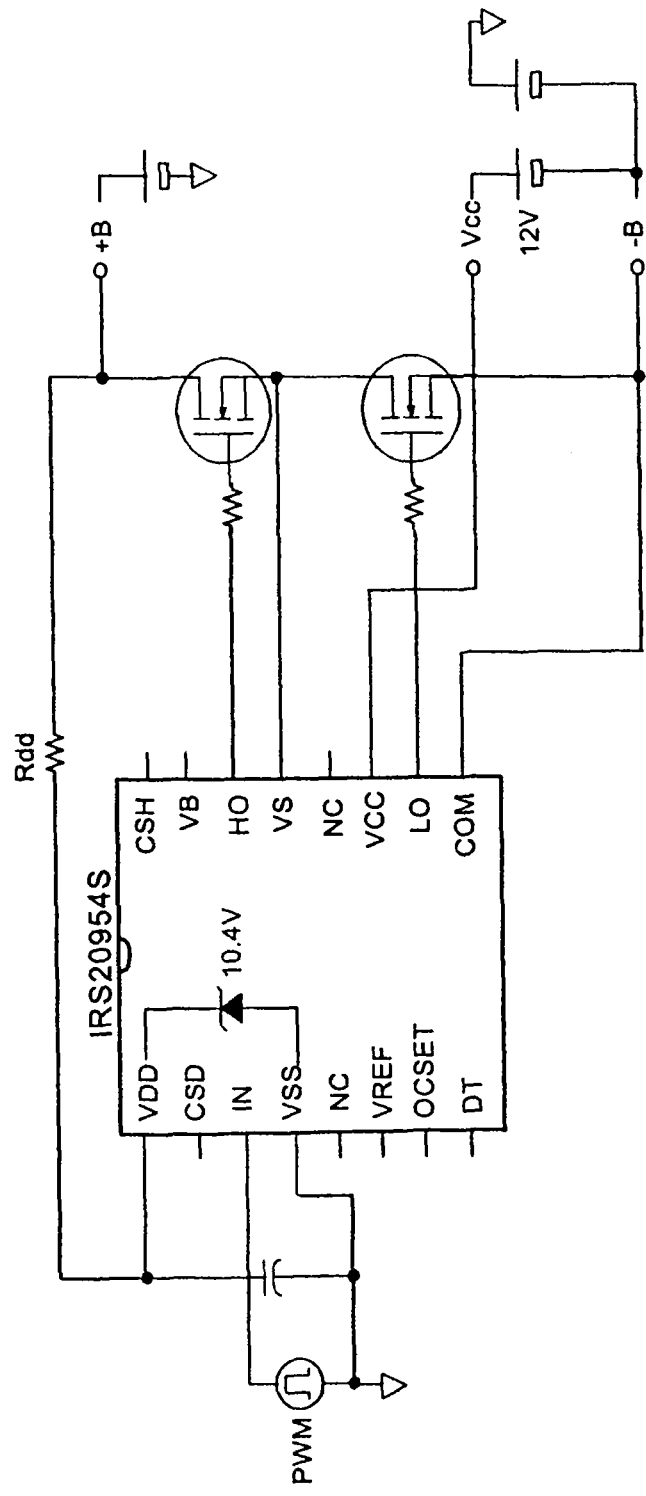
FIG. 11 is a diagram illustrating floating input power supply to the driver IC of the present invention.

As illustrated in FIG. 11 $V_{DD}$ is designed to be supplied with the internal Zener diode clamp. $V_{DD}$ supply current $I_{DD}$ can be estimated by:

$$I_{DD} = 1.5 \text{ mA} \times 300 \ 10^{-9} \times \text{switching frequency} + 0.5 \text{ mA} + 0.5 \text{ mA}$$

(Dynamic power consumption) (Static) (Zener bias)
The resistance of $R_{dd}$ to feed this $I_{DD}$ is therefore:

$$Rdd \leq \frac{V_{+B} - 10.8 \text{ V}}{I_{DD}} \ [\Omega]$$

In case of 400 kHz average PWM switching frequency, the required $I_{DD}$ is 1.18 mA. A condition using 50V power supply voltage yields Rdd-33 kn. Care must be taken to make sure that $I_{DD}$ is below the maximum Zener diode bias current, $I_{DDZ}$, at static state conditions such as a condition with no PWM input.

$$I_{DDZ} \geq \frac{V_{+B} - 10.8 \text{ V}}{Rdd} - 0.5 \text{ mA}$$

Figure 12:
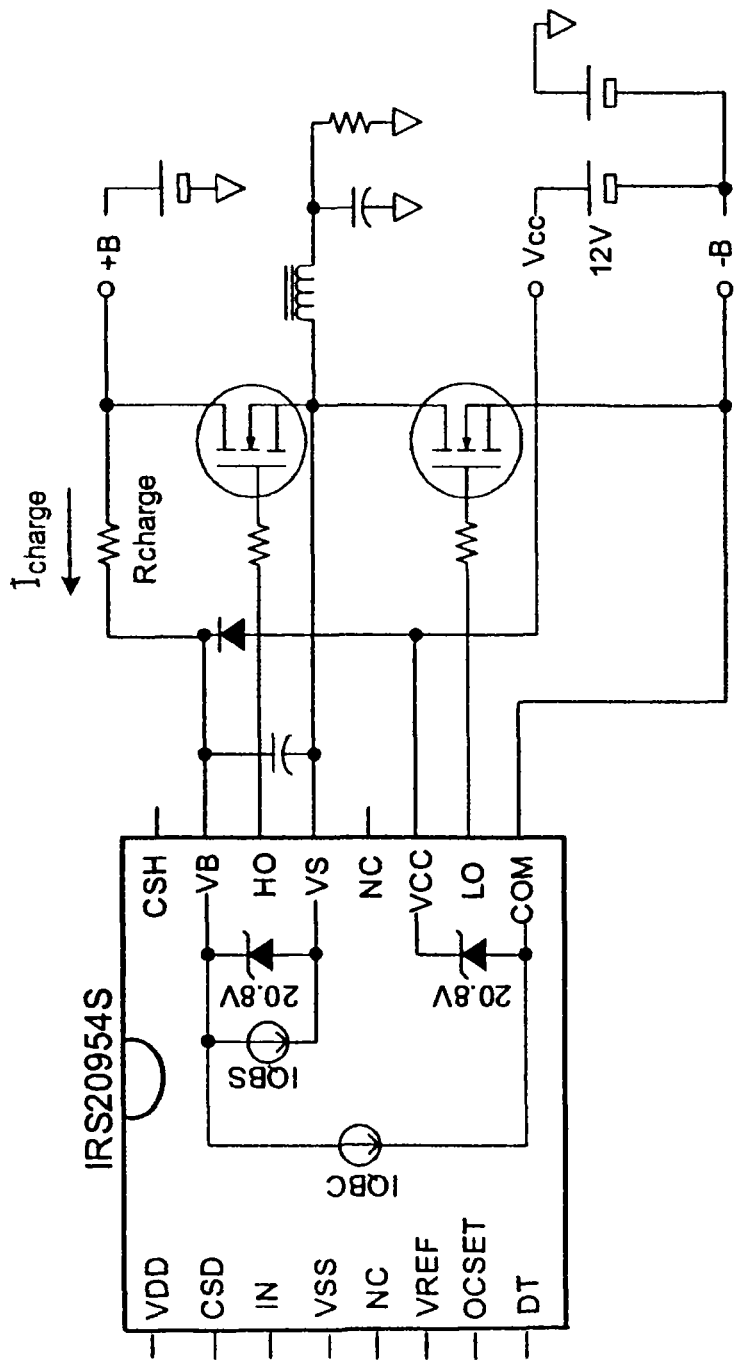
FIG. 12 is a diagram illustrating a high side bootstrap power supply that eliminates the minimum duration required for the initial low-side ON in the driver IC of the present invention.

As shown in FIG. 12, a high side bootstrap power supply that can be charged up through a resistor from the positive supply bus to $V_B$ pin by utilizing an internal 20.8 V Zener diode clamp between $V_B$ and $V_S$ pins. Advantage of this scheme is the elimination of the minimum duration required for the initial low-side ON.

To determine the requirement for $R_{charge}$, a condition of $I_{CHARGE} > I_{QBS}$, where $I_{CHARGE}$ is a required charging current through $R_{charge}$, and $I_{QBS}$ is a high side quiescent current, must be met. Note that $R_{charge}$ can drain floating supply charge during ON state of high-side, which limits maximum PWM modulation index capability of the system. $R_{charge}$ should be large enough to discharge the floating power supply during the high side ON.

The protection control block monitors the status of the power supply of $V_{DD}$ and $V_{CC}$ whether the voltages are above the Under Voltage Lockout threshold. LO and HO pins of the driver IC 10 are disabled by shutdown until the UVLO of $V_{CC}$ and $V_{DD}$ are released and CSD timer capacitor Ct is charged up. After the UVLO of $V_{CC}$ is released, CSD pin resets power-on timer. At the time the voltage at CSD pin reached the release threshold, Vth1, shutdown logic enables LO and HO pins. The over current detection blocks for the low side and high side are disabled until UVLO of $V_{CC}$ and $V_{BS}$ are released.

Figure 13:
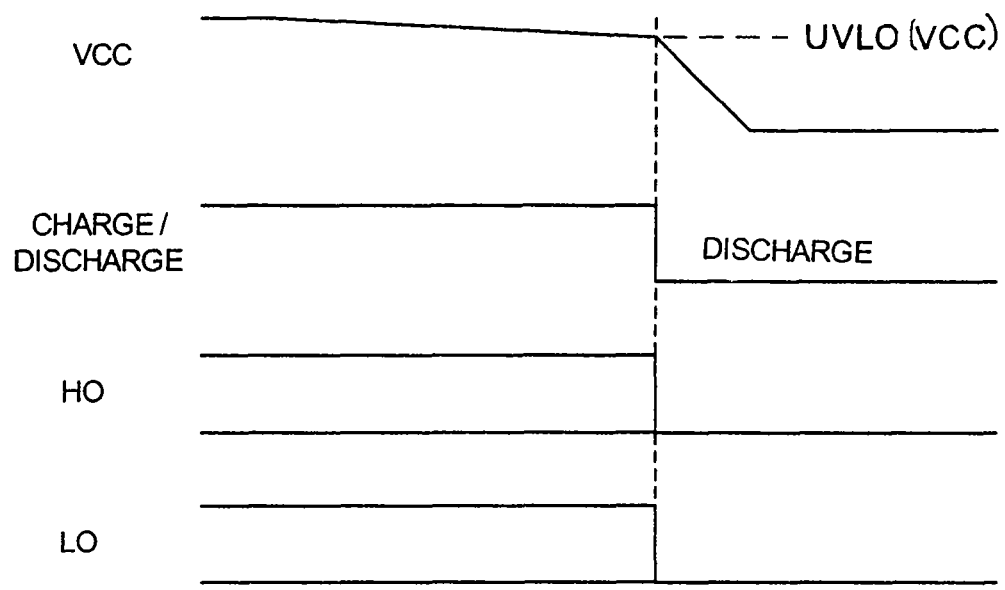
FIG. 13 is a graph illustrating that when $V_{DD}$ or $V_{CC}$ voltage level reaches the UVLO negative going threshold, protection logic sets LO and HO pins 0 V to turn off the MOSFETs.

As illustrated in FIG. 13, as soon as $V_{DD}$ or $V_{CC}$ reaches the UVLO negative going threshold, protection logic makes LO and HO pins 0 V to turn off the MOSFET.

As the driver IC 10 contains analog circuitry, careful attention to the power supply decoupling should be given to achieve proper operation. Ceramic capacitors of 0.1 μF or more close to the power supply pins are recommended.

Figure 14:
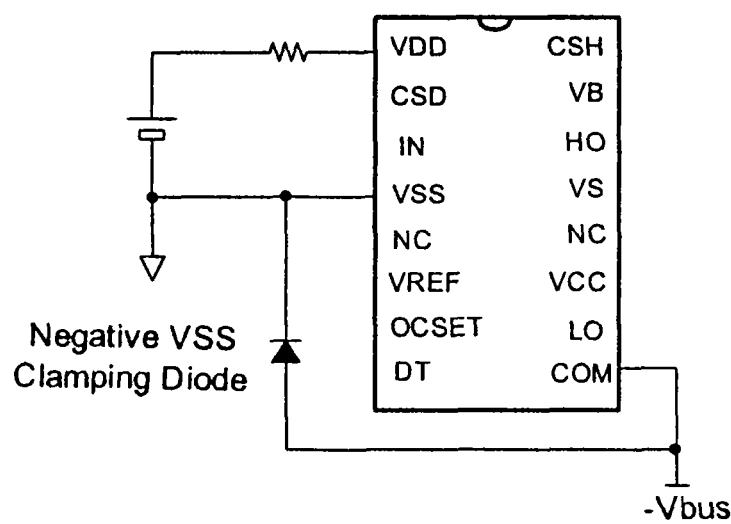
FIG. 14 is a diagram illustrating clamping of negative voltage at VSS pin of the driver IC of the present invention.

In a case where VSS pin goes below the COM pin potential such as when negative supply is missing in dual supply configuration. This causes excessive negative VSS voltage to damage the driver IC 10. Thus, as illustrated in FIG. 14, it is recommended to have a diode to clamp potential negative bias to $V_{SS}$, if there is a possibility. A standard recovery 1 A diode such as 1N4002 is sufficient in most cases for this purpose.

Junction Temperature Estimation

The power dissipation in the circuit 10 consists of following dominant items. The dissipation in floating input section is given by;

$$P_{MID} = P_{ZDD} + P_{LDD} \approx \frac{V_{+BUS} - V_{DD}}{R_{DD}} \cdot V_{DD}, \text{ where}$$

$P_{ZDD}$ is dissipation from internal zener diode clamping $V_{DD}$ voltage;
$P_{LDD}$ is dissipation from internal logic circuitry;
$V_{+BUS}$ is positive bus voltage feeding $V_{DD}$; and
$R_{DD}$ is a resistor feeding $V_{DD}$ from $V_{+BUS}$. Obtaining the value of $R_{DD}$ was discussed above.

The dissipation in the low side includes loss from logic circuitry and loss from driving LO pin, and is given by $$P_{LOW} = P_{LDD} + P_{LO} = (I_{QCC} \cdot V_{CC}) + \left(V_{CC} \cdot Q_g \cdot f_{SW} \cdot \frac{R_O}{R_O + R_g + R_{g(int)}}\right),$$

where $P_{LDD}$ is dissipation from internal logic circuitry;
$P_{LO}$ is dissipation from gate drive stage to LO pin;
$R_O$ is equivalent output impedance of LO, typically 10Ω for the circuit 10;
$R_{g(int)}$ is internal gate resistance of MOSFET; $R_g$ is external gate resistance;
$Q_g$ is total gate charge of low side MOSFET; and $P_{HIGH}$: Dissipation in High Side.

The dissipation in high side includes loss from logic circuitry and loss from driving LO pin and is given by $$P_{HIGH} = P_{LDD} + P_{HO} = (I_{QBS} \cdot V_{BS}) + \left(V_{BS} \cdot Q_g \cdot f_{SW} \cdot \frac{R_O}{R_O + R_g + R_{g(int)}}\right),$$

where $P_{LDD}$ is dissipation from internal logic circuitry;
$P_{HO}$ is dissipation from gate drive stage to LO pin;
$R_O$ is equivalent output impedance of HO, typically 10Ω for the driver IC 10;
$R_{g(int)}$ is internal gate resistance of high side MOSFET;
$R_g$ is external gate resistance; and $Q_g$ is total gate charge of high side MOSFET.

Then, total dissipation of Pd is given by $P_d = P_{MID} + P_{LOW} + P_{HIGH}$. Estimated $T_j$ from the thermal resistance between ambient and junction temperature, $Rth_{JA}$ $T_j = Rth_{JA} \cdot P_d + T_A < 150°$ C.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A digital audio driver having a pulse-width modulation (PWM) input and controlling a stage of high- and low-side MOSFETs series connected at a node, the driver comprising:
   an input interface circuit having a protection circuit to provide protection against an over-current condition at least one of the high- and low-side MOSFETs; and
   high and low side circuits for driving the high- and low-side MOSFETs, each high and low side circuit including a current sensing circuit which requires no external shunt resistor to detect the over-current condition at either positive or negative load current direction,
   wherein at least one of the current sensing circuits uses a drain to source resistance ($R_{DS(ON)}$) of the at least one of the high- and low-side MOSFETs as a current sensing resistor and once the $R_{DS(ON)}$ exceeds a pre-determined threshold, feeds an over current output signal to the protection circuit to shutdown one of the high- and low-side MOSFETs independently from shutdown of the other of the high- and low-side MOSFETs.

2. The driver of claim 1, wherein the MOSFETs provide voltage used to amplify a speaker, the speaker being connected to the node via an inductor, a capacitor being connected between the inductor and the speaker.

3. The driver of claim 1, wherein an external timing capacitor is connected to the protection circuit for measuring a resume timing interval to resume operation of the at least one of the high- and low-side MOSFETs.

4. The driver of claim 3, wherein the protection circuit further comprises a latch circuit for shutting down outputs to the high- and low-side MOSFETs using a shutdown signal, wherein if a cause of the over-current condition is present, the protection circuit repeatedly determines when one of the current sensing circuits detects the over-current condition and the external timing capacitor is allowed to discharge;
   wherein when the external timing capacitor crosses a lower threshold voltage, the latch circuit is reset and the external timing capacitor is allowed to charge; and
   wherein when the external timing capacitor crosses an upper threshold voltage, a release of the shutdown signal is enabled.

5. The driver of claim 3, wherein the resume interval timing is long enough to avoid over heating and failure of the high- and low-side MOSFETs.

6. The driver of claim 3, wherein if high and low side supply voltages are above the Under Voltage Lockout threshold control signals to the high- and low-side MOSFETs are disabled until the high and low side supply voltages are below the Under Voltage Lockout threshold and the external timing capacitor is charged.

7. The driver of claim 4, wherein when the external timing capacitor is discharged below the lower threshold voltage, the driver enters a shutdown mode.

8. The driver of claim 1, wherein a current of the low-side MOSFET is sensed based on measurement of voltage across source and drain terminals of the low side MOSFET at its ON state.

9. The driver of claim 8, wherein to avoid incorrect current value due to an overshoot condition, sensing of the voltage at the node ignores signals for the first 200 ns after the low-side MOSFET is turned on.

10. The driver of claim 9, further comprising a low threshold circuit to program a threshold for low side over-current sensing, the low threshold circuit having an external resistive divider to provide better immunity against voltage fluctuations of the low side circuit.

11. The driver of claim 10, wherein the resistive divider of about 10 kΩ total is used to drain about 0.5 mA.

12. The driver of claim 1, wherein a current of the high-side MOSFET is sensed based on a measurement of voltage across source and drain terminals of the high-side MOSFET at its ON state.

13. The driver of claim 12, wherein if over load condition is detected the high-side MOSFET is shutdown.

14. The driver of claim 13, wherein sensing of the current through the high-side MOSFET is delayed by about 300 ns when the high-side MOSFET is turned ON to neglect overshoot ringing at the switching edges.

15. The driver of claim 14, wherein a threshold is preset at about 1.2 V and an external resistive divider is provided to program a higher threshold value.

16. The driver of claim 1, wherein the high-side MOSFET is connected to a positive supply bus, a high-side bootstrap power supply connected across the positive supply bus and the node, the high-side bootstrap power supply connected to the positive supply bus through a charge resistor.

17. A digital audio driver having a pulse-width modulation (PWM) input and controlling a stage of high- and low-side FETs series connected at a node, the driver comprising:
   a current sensing circuit to detect an over-current condition at one of said high- and low-side FETs without using an external shunt resistor;

wherein the current sensing circuit uses a drain to source resistance ($R_{DS(ON)}$) of the one of the high- and low-side FETs as a current sensing resistor and once the $R_{DS(ON)}$ exceeds a pre-determined threshold, feeds an over current output signal to a protection circuit to shutdown the one of the high- and low-side FETs independently from shutdown of the other of the high- and low-side FETs.

* * * * *